(12) United States Patent
Agarwal et al.

(10) Patent No.: US 10,825,692 B2
(45) Date of Patent: Nov. 3, 2020

(54) SEMICONDUCTOR CHIP GETTERING

(71) Applicant: ADVANCED MICRO DEVICES, INC., Santa Clara, CA (US)

(72) Inventors: Rahul Agarwal, Livermore, CA (US); Milind S. Bhagavat, Los Altos, CA (US); Ivor Barber, Los Gatos, CA (US); Venkatachalam Valliappan, Singapore (SG); Yuen Ting Cheng, Singapore (SG); Guan Sin Chok, Singapore (SG)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/226,790

(22) Filed: Dec. 20, 2018

(65) Prior Publication Data

US 2020/0203177 A1 Jun. 25, 2020

(51) Int. Cl.
*H01L 21/322* (2006.01)
*H01L 29/34* (2006.01)
*H01L 21/268* (2006.01)

(52) U.S. Cl.
CPC ........ *H01L 21/3221* (2013.01); *H01L 21/268* (2013.01); *H01L 29/34* (2013.01)

(58) Field of Classification Search
CPC .................................................. H01L 21/3221
USPC ....................................................... 257/617
See application file for complete search history.

(56) References Cited

U.S. PATENT DOCUMENTS

| | | | |
|---|---|---|---|
| 4,131,487 A * | 12/1978 | Pearce | ................ H01L 21/3221 438/473 |
| 4,645,546 A | 2/1987 | Matsushita | |
| 6,255,727 B1 * | 7/2001 | Khoury | .................... G01R 3/00 257/48 |
| 6,967,392 B2 | 11/2005 | Tsai et al. | |
| 8,193,039 B2 | 6/2012 | Su et al. | |
| 8,338,961 B2 | 12/2012 | Su et al. | |
| 2002/0170891 A1 * | 11/2002 | Boyle | .................... B23K 26/12 219/121.67 |
| 2008/0237844 A1 | 10/2008 | Aleksov et al. | |
| 2009/0079067 A1 | 3/2009 | Gerber | |
| 2009/0134500 A1 | 5/2009 | Kuo | |
| 2009/0189245 A1 | 7/2009 | Furusawa et al. | |

(Continued)

FOREIGN PATENT DOCUMENTS

JP 59108322 A * 6/1984 ......... H01L 21/3221

OTHER PUBLICATIONS

L. Rihakov et al.; *Laser Micromachining of Glass, Silicon, and Ceramics*; Advances in Materials Science and Engineering; vol. 2015, Article ID 584952; 2015; pp. 1-7.

(Continued)

*Primary Examiner* — Ajay Arora

(57) ABSTRACT

Various semiconductor chips with gettering regions and methods of making the same are disclosed. In one aspect, an apparatus is provided that includes a semiconductor chip that has a first side and a second side opposite the first side. The first side has a plurality of laser ablation craters. Each of the ablation craters has a bottom. A gettering region is in the semiconductor chip beneath the laser ablation craters. The gettering region includes plural structural defects. At least some of the structural defects emanate from at least some of the bottoms of the laser ablation craters.

18 Claims, 8 Drawing Sheets

(56) References Cited

U.S. PATENT DOCUMENTS

2010/0078772 A1    4/2010   Robinson
2010/0237472 A1    9/2010   Gillis et al.
2012/0074579 A1*  3/2012   Su .................... H01L 21/76898
                                                                              257/774

OTHER PUBLICATIONS

Arthur Keigler, et al.; *Copper Deposition for Pillars and Vias*; Semiconductor Manufacturing Magazine; vol. 7, Issue 8; Aug. 2006; pp. 1-6.

* cited by examiner

SEMICONDUCTOR CHIP GETTERING

BACKGROUND OF THE INVENTION

Conventional semiconductor chips or dies are routinely fabricated en masse in large groups as part of a single semiconductor wafer. At the conclusion of the processing steps to form the individual dies, a so-called dicing or sawing operation is performed on the wafer to cut out the individual dies. Thereafter, the dies may be packaged or directly mounted to a printed circuit board of one form or another.

A typical conventional semiconductor wafer is manufactured with scores or more dies. This fabrication process consists of a large number of manufacturing steps, such as photolithography, ion implants, anneals, etches, chemical and physical vapor deposition and plating to name a few. Significant effort is expended by semiconductor manufacturers toward the goal of achieving nearly identical manufacturing outcomes for the individual semiconductor dies of a wafer.

Transistors in conventional wafer fab processes are susceptible to metal contamination from metals such as copper and sodium. Copper can also be introduced as an impurity at the die packaging stage or even during operation (known as in-field contamination). Copper is widely used for chip conductors due to its desirable conductivity. However, copper exhibits a relatively high diffusivity in silicon. To tackle the problem of copper contamination, some conventional wafer processes incorporate fabrication of a gettering layer on the backside of wafers. Some conventional wafer level gettering layer formation techniques include intrinsic gettering and extrinsic gettering. Intrinsic gettering involves introducing bulk micro defects by controlled formation of oxide precipitates in the silicon ingot from which the wafers are cut. Two conventional wafer level extrinsic gettering layer formation techniques include deposition of backside films, such as silicon oxide, silicon nitride or epitaxial silicon, which impart localized strains to create lattice defects, and backside wafer grinding.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
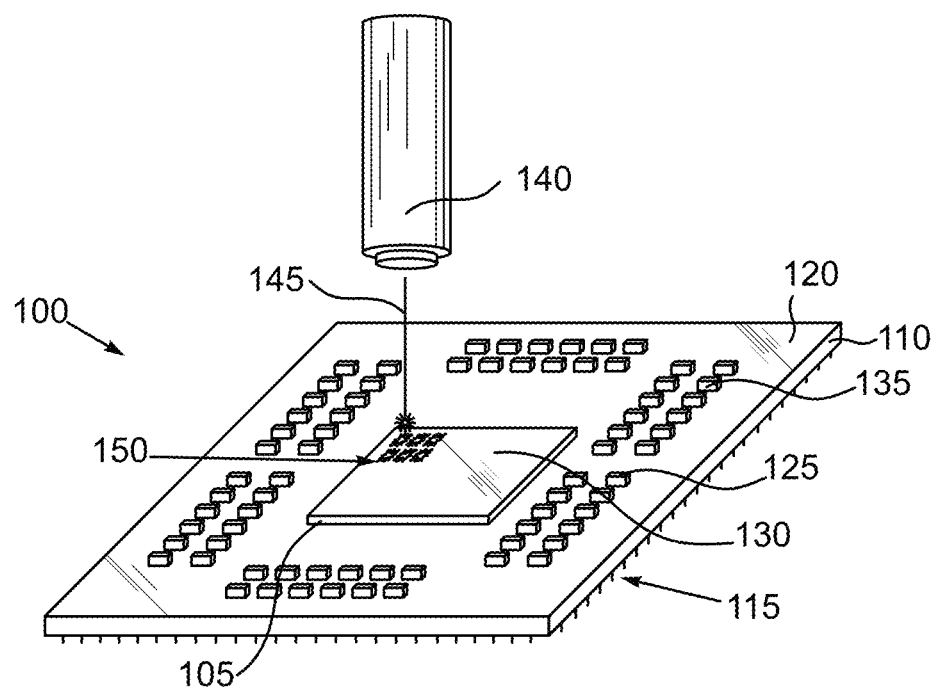
FIG. 1 is a pictorial view of an exemplary semiconductor chip device.

Conventional gettering formation techniques are wafer level processes performed before singulation. Conventional intrinsic gettering by way of introducing bulk micro defects through controlled formation of oxide precipitates in silicon ingots is inexact and may not provide reliable copper contamination protection. Conventional wafer level extrinsic gettering layer formation techniques through deposition of backside films requires expensive foundry equipment. Conventional backside wafer grinding can cause wafer warpage and breakage and can be difficult if not impossible for very thin wafers of less than 100 microns.

The disclosed new arrangements and techniques utilize laser pulses to irradiate singulated die backsides. The laser pulses create multitudes of laser ablation craters. When the laser ablation craters are created, structural defects are created in the semiconductor material proximate the backsides. The structural defects create amorphous regions which function as gettering regions. The techniques do not require expensive foundry machinery, and can be performed on chips, with sub-100 micron thicknesses or not, without the grinding risks. Although laser scribing has been conventionally done on die backsides for engraving die and vendor markings, such conventional scribing is performed with laser parameters designed to avoid causing structural defects and typically only over a fraction of die backside surface areas.

In accordance with one aspect of the present invention, an apparatus is provided that includes a semiconductor chip that has a first side and a second side opposite the first side. The first side has a plurality of laser ablation craters. Each of the ablation craters has a bottom. A gettering region is in the semiconductor chip beneath the laser ablation craters. The gettering region includes plural structural defects. At least some of the structural defects emanate from at least some of the bottoms of the laser ablation craters.

In accordance with another aspect of the present invention, an apparatus is provided that includes a package substrate and a semiconductor chip mounted on the package substrate. The semiconductor chip has a first side and a second side opposite the first side. The second side faces the package substrate. The first side has a plurality of laser ablation craters. Each of the ablation craters has a bottom. A gettering region is in the semiconductor chip beneath the laser ablation craters. The gettering region includes plural structural defects. At least some of the structural defects emanates from at least some of the bottoms of the laser ablation craters.

In accordance with another aspect of the present invention, a method of manufacturing is provided that includes irradiating a first side of a semiconductor chip with laser pulses that have a pulse duration to create a plurality of laser ablation craters. Each of the ablation craters has a bottom. The pulse duration is long enough to create a gettering region in the semiconductor chip beneath the laser ablation craters. The gettering region includes plural structural defects. At least some of the structural defects emanate from at least some of the bottoms of the laser ablation craters.

In the drawings described below, reference numerals are generally repeated where identical elements appear in more than one figure. Turning now to the drawings, and in particular to FIG. 1, therein is depicted a pictorial view of an exemplary semiconductor chip device 100 that includes a semiconductor chip 105 mounted on a circuit board 110. The semiconductor chip 105 can be virtually any type of integrated circuit, a non-exhaustive list of examples includes a central processing unit (CPU), an integrated circuit dedicated to video processing, a graphics processing unit (GPU), an accelerated processing unit (APU) that combines CPU and GPU functions, an application specific integrated circuit or other device. The semiconductor chip 105 can be composed of silicon, gallium arsenide or other types of semiconductor materials, and can be monolithic semiconductor or a semiconductor on insulator substrate, such as silicon on oxide or silicon on sapphire. The semiconductor chip 105 is flip-chip mounted on the package substrate 110 in this illustrative arrangement. However, other mounting schemes are envisioned.

The circuit board 110 can be a package substrate or other type of circuit board, and can be a multi-layer organic, a ceramic or other type of circuit board. To interface electrically with another device such as a socket (not shown) the package substrate 110 can include plural interconnects 115, which in this illustrative arrangement are pins that form a pin grid array. However, the skilled artisan will appreciate that other types of interconnects, such as ball grid arrays, land grid arrays or others can be used. The upper surface 120 of the circuit board 110 is populated with plural passive components 125, which can be capacitors, resistors, inductors or others.

FIG. 1 depicts the back side 130 of the semiconductor chip 105 undergoing a laser treatment. A laser 140 is used to deliver laser pulses 145 to the back side 130. The purpose of the laser treatment is to intentionally damage the semiconductor material at the back side 130 to create an amorphous region that will include various types of defects such as cracks, voids and others that act as a gettering region to attract various contaminants that may be present in the semiconductor chip 105, such as copper, sodium, potassium, iron or others. The laser pulses 145 create ablation craters in the backside 130. At this point a small group 150 of the ablation craters have been created. The parameters for the laser pulses 145 such as wave length, pulse duration, angle of incidence and others are selected to create by way of ablation and thermal expansion, the aforementioned intentionally damaged areas of the back side 130.

Figure 2:
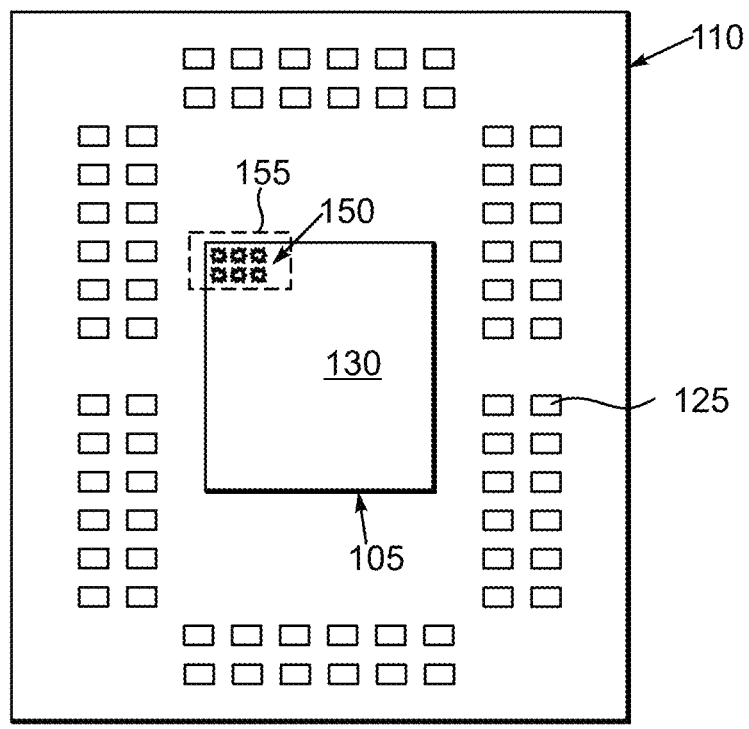
FIG. 2 is a plan view of the exemplary semiconductor chip device.

FIG. 2 is an overhead view of the package substrate 100 and the semiconductor chip 105 showing the same features as FIG. 1. Note that just the small group 150 of the ablation craters has been created at this point. It should be understood that the small group 150 of ablation craters is not drawn to scale and may be much smaller than what is depicted in FIGS. 1 and 2. Note the location of the dashed rectangle 155 in FIG. 2, the dashed rectangle 155 surrounds the small group 150 of ablation craters and a portion of a corner of the semiconductor chip 105. That portion of FIG. 2 circumscribed by the dashed rectangle 155 will be shown at greater magnification in FIG. 3.

Figure 3:
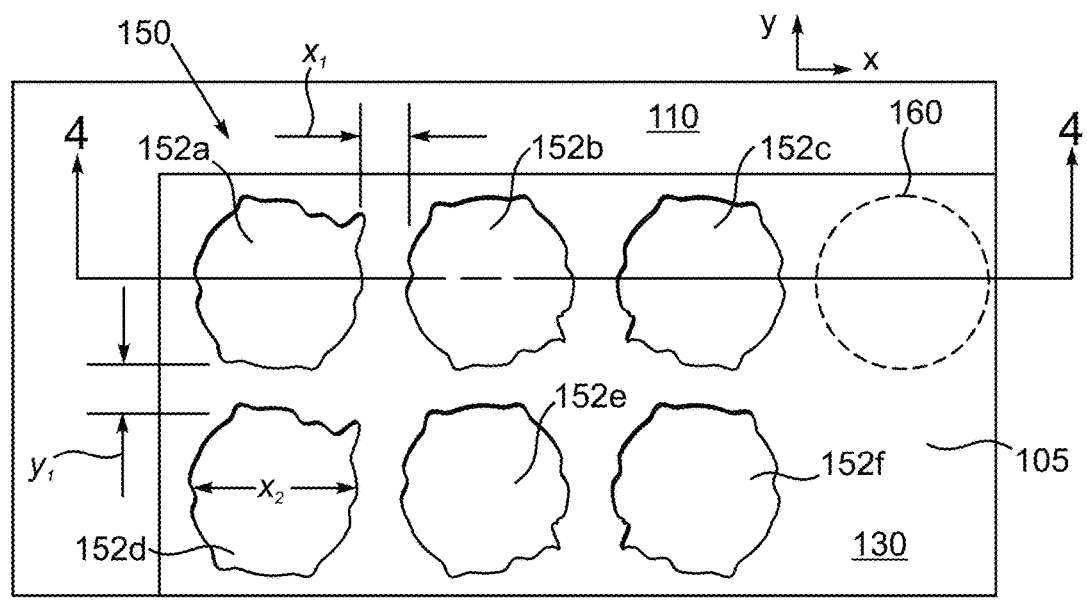
FIG. 3 is a portion of FIG. 2 shown at greater magnification.

Attention is now turned to FIG. 3, which as just noted, is the portion of FIG. 2 circumscribed by the dashed rectangle 155. A corner portion of the semiconductor chip 105, and in particular the upper surface 130 thereof, is depicted as well as a small portion of the circuit board 110 upon which the semiconductor chip 105 is mounted. The individual ablation craters 152a, 152b, 152c, 152d, 152e and 152f of the small group 150 of ablation craters have been ablated into the back side 130 of the semiconductor chip 105 using the laser pulses 145 described above. The dashed circle 160 represents the next targeted area of the backside 130 and the approximate size of the laser spot that will burn the next ablation crater. Although the laser spot that will hit the area at the dashed circle 160 is typically circular, the actual footprints of the ablation craters 152a, 152b, 152c, 152d, 152e and 152f, while generally tracking the footprint of the laser spot, but will typically be somewhat irregular as shown due to the irregularities in the heating and ablation of the bask side 130 of the semiconductor chip 105. The ablation craters 152a, 152b, 152c, 152d, 152e and 152f can be fabricated with some spacing $x_1$ along an x axis and some spacing $y_1$ along a y axis, where the x and y axes are just to conveniently describe directions. Smaller values for $x_1$ and $y_1$ yield more disruptions of the lattice structure and stronger gettering. Indeed, $x_1$ and $y_1$ could be set to zero to create, in essence, fewer, but larger ablation craters. Laser spot size and laser pulse length are chosen to yield some typical lateral dimension $x_2$ of the ablation craters 152a, 152b, 152c, 152d, 152e and 152f. In this exemplary arrangement, the dimension $x_2$ can be about 100 to 1000 nm.

Figure 4:
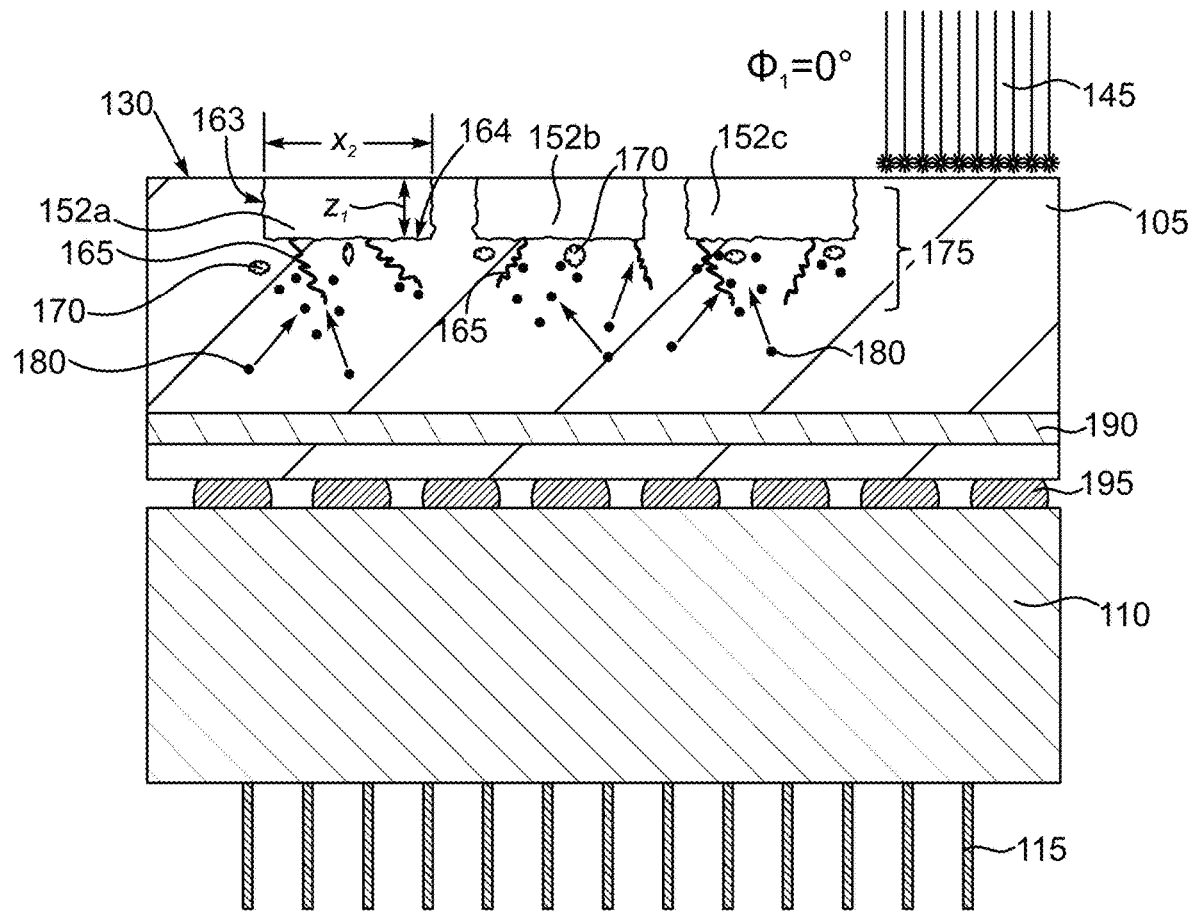
FIG. 4 is a sectional view of FIG. 3 taken at section 3-3.

Additional details of the ablation craters 152a, 152b and 152c and the semiconductor chip 105 can be understood by referring now also to FIG. 4, which is a sectional view of FIG. 3 taken at section 4-4. Note that due to the location of section 4-4, the three ablation craters 152a, 152b and 152c are visible. The following discussion of the ablation craters 152a, 152b, 152c, 152d, 152e and 152f will be illustrative of the others. The creation of each of the ablation craters 152a, 152b and 152c involves a combination of ablation of the semiconductor material of the chip 105 and in particular the back side 130 thereof and a rapid heating, which produces not only the ablation craters 152a, 152b and 152c but also rapid thermal expansion of the material of the chip 105 surrounding the craters 152a, 152b and 152c. The ablation process will typically yield roughened sidewalls 163 and bottoms 164 of the ablation craters 152a, 152b and 152c. Localized melting occurs at the sidewalls 163 and bottoms 164. The melting, sputter evaporation and rapid thermal expansion produces a variety of structural defects in the semiconductor material of the semiconductor chip 105, such as, cracks 165 and voids 170. These cracks 165 and voids 170 disrupt the crystal lattice of the semiconductor material in the chip 105 producing, in essence, an amorphous region 175 which functions as a gettering region to attract impurities 180, such as, copper or other impurities. The amorphous region 175 can consist of plural gettering regions, one proximate each of the ablation craters 152a, 152b and 152c, or if spaced closely enough laterally, one expansive gettering region. The structure and position of the cracks 165 and 170 for each of the ablation craters 152a, 152b and 152c will be highly irregular in number, size and position. However, at least some of the structural defects emanate from the bottoms 164 of the ablation craters 152a, 152b, 152c, 152d, 152e and 152f. When the laser pulse 145 strikes the next area to be burned, the aforementioned ablation plus rapid thermal expansion will occur. In this illustrative arrangement, the angle of incidence $\Phi_1=0°$ (i.e., perpendicular) for the laser radiation 145. However, as described in more detail below, other angles of incidence are envisioned. Laser spot size and laser pulse length are chosen to yield some typical average depth $z_1$ of the ablation craters 152a, 152b, 152c, 152d, 152e and 152f. The average depth $z_1$ is an average depth since the bottoms 164 are not smooth, and are instead rough and irregular. The average depth $z_1$ can be about 100 to 2000 nm.

Note that the semiconductor chip 105 can be electrically connected to the circuit board 110 by way of plural interconnects 195, which can be solder bumps, micro bumps, conductive pillars, or other types of interconnect structures.

Again, the circuit board 110 is depicted as a pin grid array with pin interconnects 115 but others can be used as well as described above. The semiconductor chip 105 includes an active or device region 190 populated with multitudes of circuit structures, such as transistors, capacitors, resistors and others. The device region 190 is electrically connected to the interconnect structures by multitudes of conductor structures not shown for simplicity of illustration.

The parameters for the laser energy 145 are selected to cause ablation and lattice disruption but without overheating or damaging the semiconductor chip 105 to an extent that would damage the device region 190. The following table lists some exemplary laser ablation parameters assuming silicon as the material to be ablated:

TABLE

| Laser Wavelength | 355 nm or 532 nm |
| --- | --- |
| Laser Spot Size | 100 to 1000 nm |
| Laser Pulse Duration | >15 nano seconds (ns) |
| Laser Pulses Per Ablation Crater | 1 to 3 |
| Laser Energy Density | $10^9$ to $10^{11}$ J-cm$^2$ |
| Laser Type | Nd: YAG solid state |

Conventional laser scribing uses a laser pulse duration that is shorter than the time it will take for the generated heat to flow to the surrounding silicon. This thermal conduction time is about 50 pico seconds (ps), so conventional laser scribing pulses are typically kept shorter than 50 ps to avoid damage to the silicon crystal structure. However, the disclosed laser ablation techniques seek to cause damage to the crystal structure in the semiconductor chip 105 near the ablation craters 152a, 152b, 152c, 152d, 152e and 152f. Accordingly, the laser pulse duration is much longer than the conventional scribing technique, but not so long as to cause damage to the active region 190. The parameters in the table above can be varied while maintaining the technical objective of causing structural damage to create the gettering region 175 and the disclosed alternative gettering regions without harming the functionality of the chip 105 and the disclosed alternative chips.

As noted above, various values for average depths $z_1$ can be used for the ablation craters 152a, 152b, 152c, 152d, 152e and 152f. In this illustrative arrangement, all the ablation craters 152a, 152b, 152c, 152d, 152e and 152f are subjected to the same pulse duration and energy and thus have approximately the same average depth $z_1$. It should be understood that the creation of the ablation craters 152a, 152b, 152c, 152d, 152e and 152f and additional ablation craters can span the entire back side 130 of the semiconductor chip 105 or some subset thereof as desired.

Figure 5:
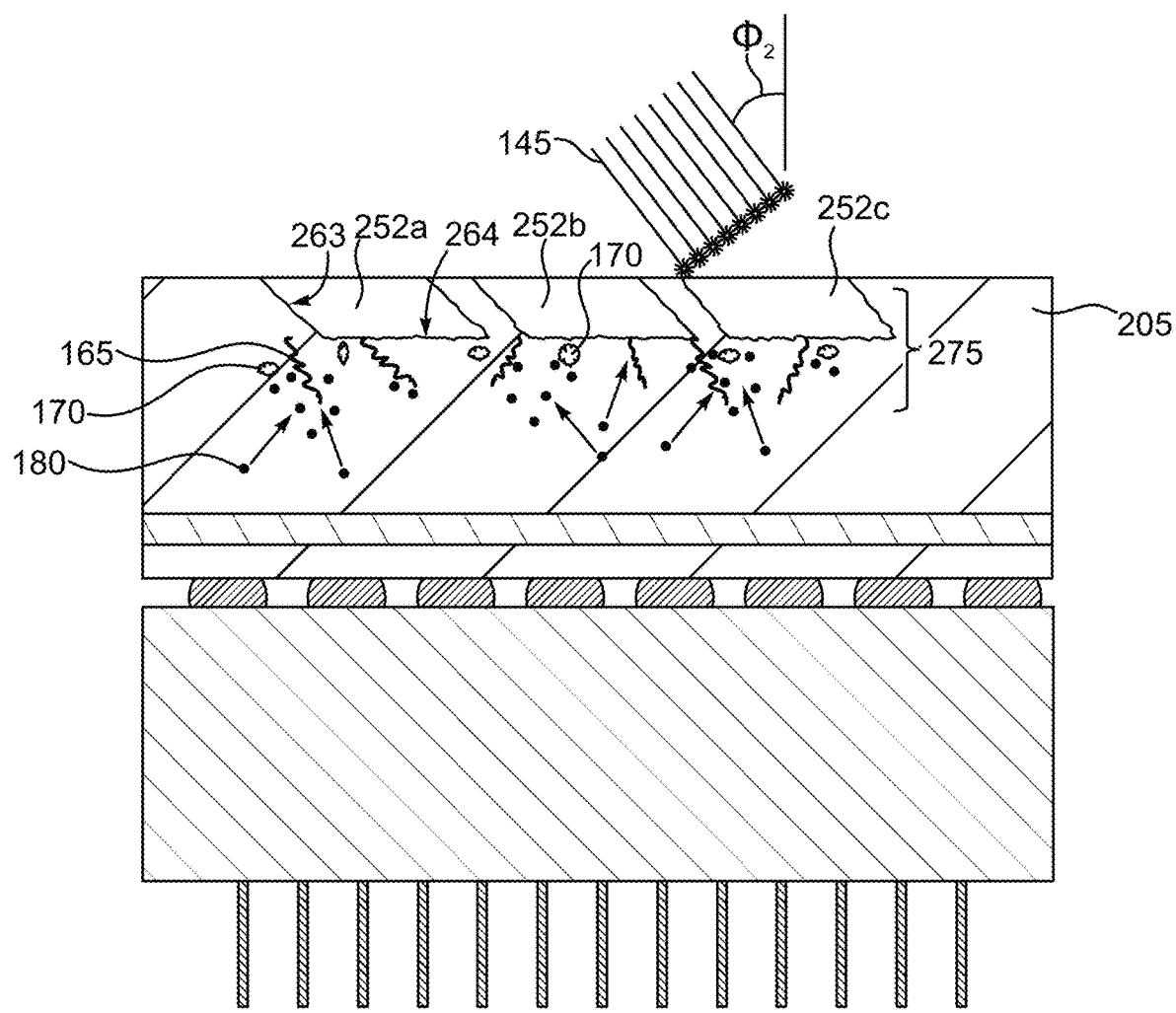
FIG. 5 is a sectional view like FIG. 4, but depicting alternate exemplary laser ablation crater formation.

FIG. 5 is a sectional view like FIG. 4, but depicting an alternate exemplary laser treatment. Here, the semiconductor chip 105 subjected to the irradiation by the laser pulses 145 but at some angle of incidence $\Phi_2$, which is non-zero to create ablation craters 252a, 252b and 252c, which have slanted side walls 263 and generally horizontal bottoms 264. The creation of the ablation craters 252a, 252b and 252c and additional ablation craters, as in the other disclosed arrangements, creates the aforementioned defects such as cracks 165 and voids 170, some of which emanate from the bottoms 264, and thereby establishes an amorphous gettering region 275 to attract the contaminant particles 180. It is anticipated that $\Phi_2$ can be virtually any angle greater than zero and less than about 60°.

Figure 6:
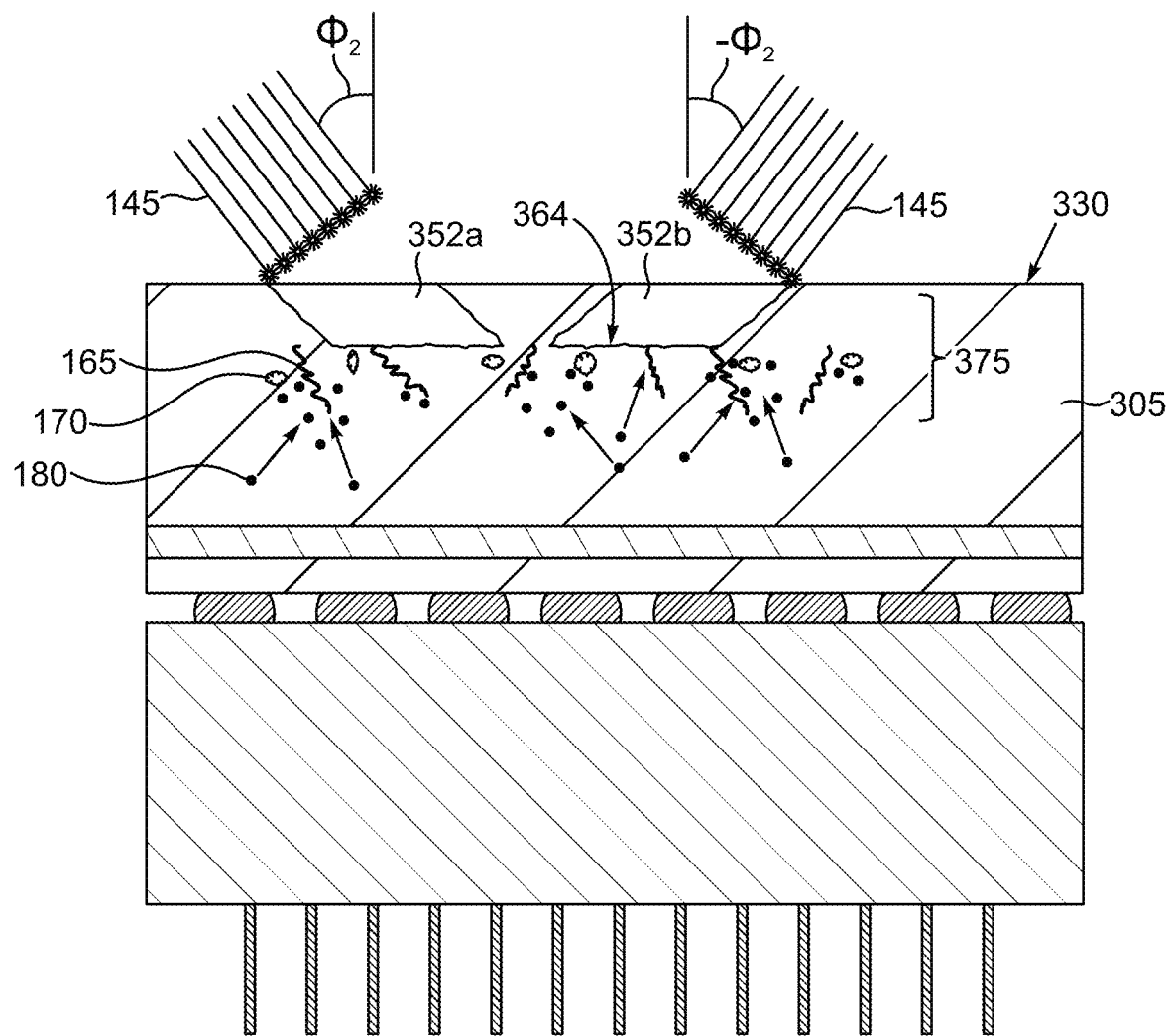
FIG. 6 is a sectional view like FIG. 5, but depicting alternate exemplary laser ablation crater formation.

In the arrangement illustrated in FIG. 5, the ablation craters 252a, 252b and 252c are all created using the laser energy 145 at the same angle of incidence $\Phi_2$. However, the skilled artisan will appreciate that other techniques can be used. For example, and as shown in FIG. 6, which is a sectional view like FIG. 5, a semiconductor chip 305 can be subjected to laser treatment with laser pulsed 145. Here one laser pulse 145 is directed at some angle of incidence $\Phi_2$ to the semiconductor chip 305 to create an ablation crater 352a with a tilt that roughly matches $\Phi_2$ and thereafter another laser pulse 145 is directed at some angle of incidence $-\Phi_2$ to the semiconductor chip 305 to create an adjacent ablation crater 352b with a tilt of roughly $-\Phi_2$ and so on and so forth across the backside 330 of the semiconductor chip 305 again with the goal of creating the aforementioned cracks 165, voids 170 and other defects, some of which emanate from the bottoms 364, to establish an amorphous gettering region 375 that attracts impurities 180.

Figure 7:
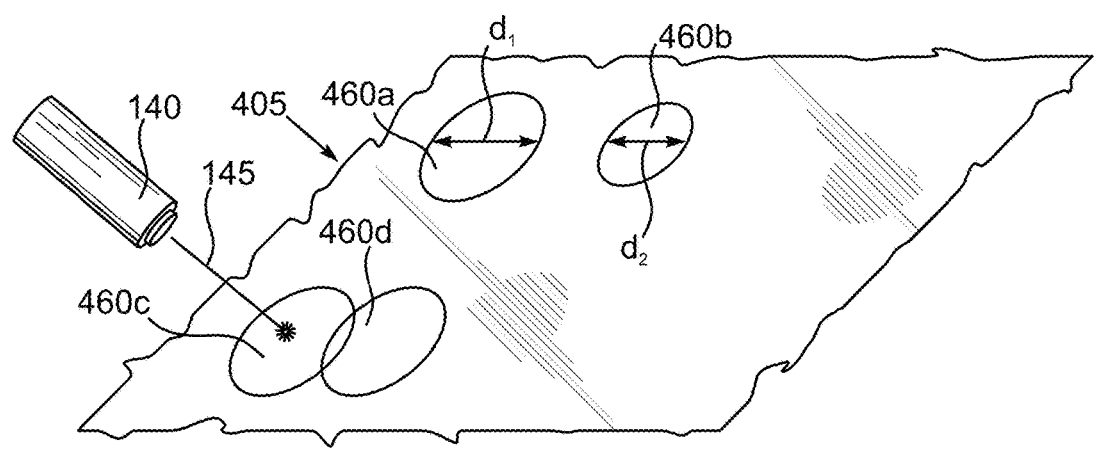
FIG. 7 is a pictorial view of a portion of an exemplary semiconductor chip and laser spots.
Figure 8:
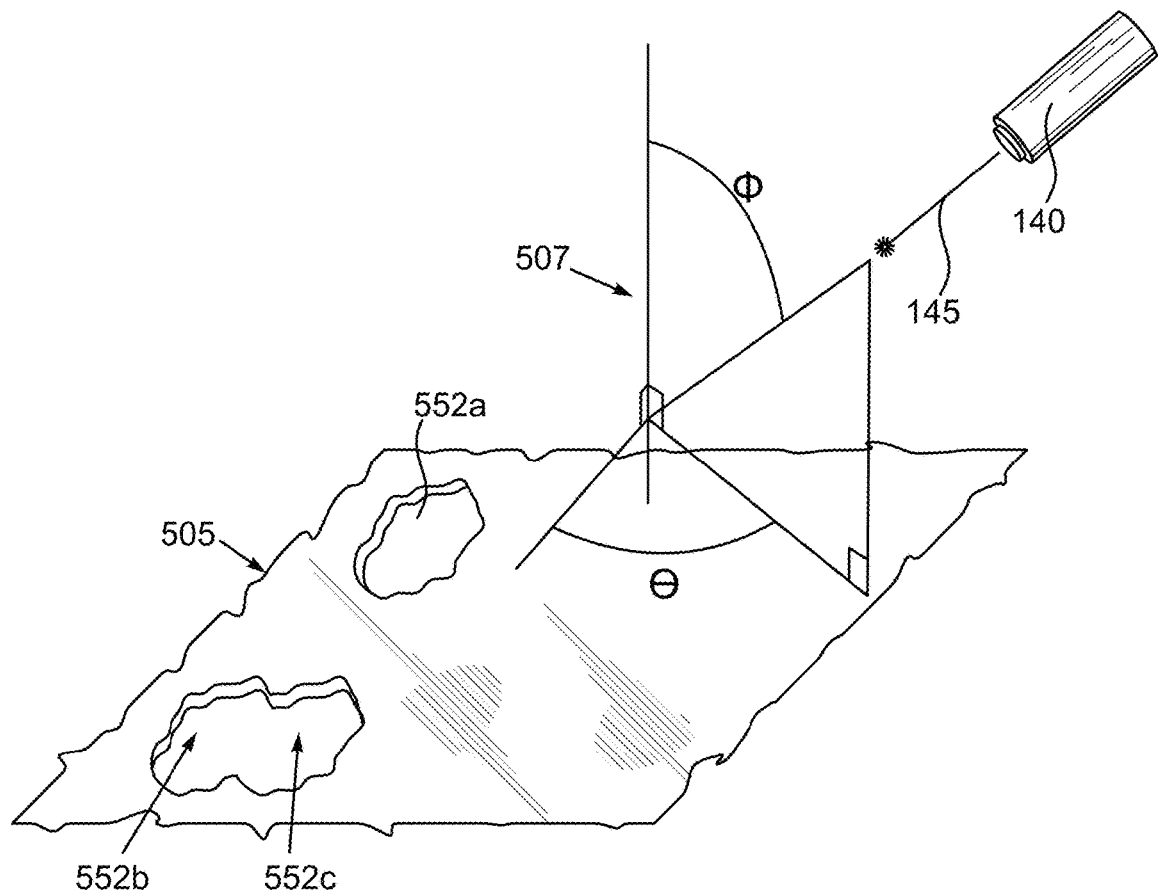
FIG. 8 is a pictorial view of a portion of an exemplary semiconductor chip and exemplary laser targeting.

FIGS. 7 and 8 depict in pictorial form a few of the alternative methods and arrangements envisioned by the present detailed disclosure. Turning first to FIG. 7, therein is depicted a pictorial view of a portion of a semiconductor chip 405 that can be like the chip 105 or other alternative arrangements disclosed herein. Note that only a small portion of the chip 405 is depicted. As shown in FIG. 7, the laser 140 can be controlled to do a variety of variations of spot size and spot size positioning. FIG. 7 depicts four laser spots 460a, 460b, 460c and 460d. Each of the laser spots 460a, 460b, 460c and 460d represents the laser spot size and the laser target location on the chip 405. For example, FIG. 7 shows one laser spot size 460a with some diameter $d_1$ and next door another possible laser spot size 460b with some diameter $d_2$ that is smaller than $d_1$. The point here is that spot sizes 460a or 460b can be varied to achieve different sizes of ablation craters and spacings of ablation craters if desired. FIG. 7 also depicts another variation where a couple of other laser spots 460c and 460d are overlapped. This illustrates that the laser 140 can be manipulated so that a given laser spot, for example 460c, is positioned as shown and then the next laser spot 460d is targeted to laterally overlap where the laser spot 460c hit in order to fabricate overlapping ablation craters. The overlapping can be with more than just one laser spot overlapping at a time to achieve ablation craters that overlap one another at multiple locations etc. Another technique that can be employed is to use different energies for different locations. For example, the laser spot 460a can be delivered to the chip 405 with some energy level and another or other laser spot, such as the laser spot 460b, can be delivered to the chip 405 at some other energy, lower or higher, as desired.

Attention is now turned to FIG. 8, which is a pictorial view of a small portion of another semiconductor chip 505. Here, a spherical coordinate system 507 is overlaid on the chip 505 and used to illustrate that the laser 140 can be rotated in spherical coordinates about angles $\Phi$ and $\Theta$ to achieve a variety of different aiming points and angular orientations of a given ablation crater, one of which is shown, and labeled 552a. Thus, for example, the laser 140 can be positioned according to some angles $\Phi$ and $\Theta$ and fired such that the laser pulse 145 creates the ablation crater 552a with a certain side wall slope and azimuthal orientation. Then, either the laser 140 or the chip 505 itself can be rotated through some other azimuthal angle $\Theta$ and another pulse delivered to generate another ablation crater with or without altering the inclination angle $\Phi$. In other words, the chip 505 can be blasted with the laser pulses 145 from a variety of angular positions $\Phi$ and $\Theta$ of the laser 140 to achieve a great variety of different types of texturing of the semiconductor chip 505. As noted above, operation of the laser 140 can be tailored to yield laterally overlapping craters, such as the overlapping craters 552b and 552c.

Figure 9:
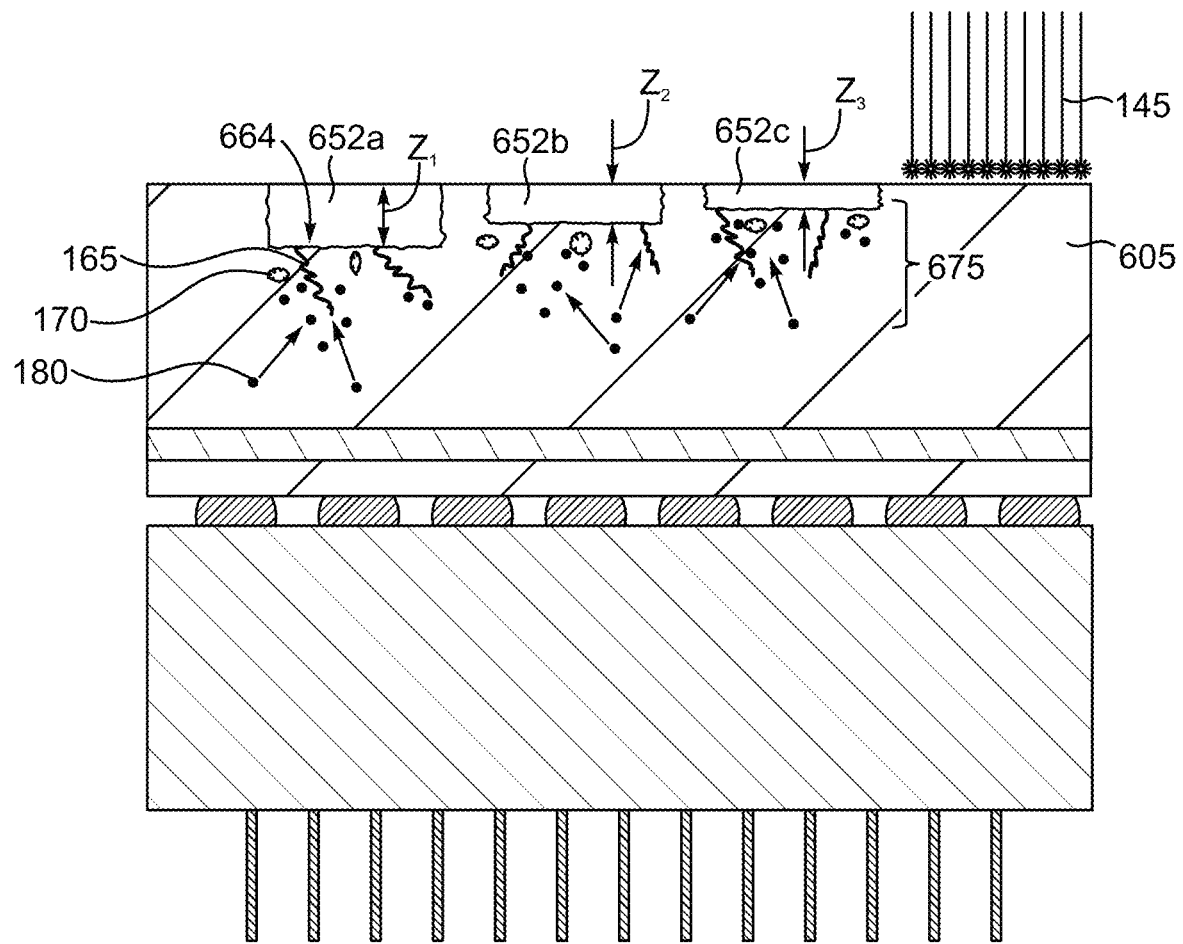
FIG. 9 is a sectional view like FIG. 5, but depicting alternate exemplary laser ablation crater formation.

In yet another arrangement depicted in FIG. 9, which is a sectional view like FIG. 6, a semiconductor chip 605 can undergo laser treatment with laser pulses 145 to produce ablation craters 652a, 652b and 652c that have different average depths $z_1$, $z_2$, $z_3$ where $z_1$ is greater than $z_2$, and $z_2$ is greater than $z_3$, etc. across the upper surface 630 of the chip 605. This can be accomplished by way of either changing the wave length of the laser 145 or using short successively shorter pulses in order to achieve shallower ablation craters 652a, 652b and 652c say at average depths $z_2$ and $z_3$ relative to $z_1$, etc. This type of treatment can be beneficial where a particular portion of the semiconductor chip 605 is more sensitive to excessive heating than others and therefore shallower craters 652c can be created in those sensitive zones. Again, the goal is to by way of ablation and rapid thermal expansion to create the aforementioned defects 165 and 170, some of which emanate from the bottoms 664, which make up the gettering region 675 of the chip 605. Of course the techniques illustrated in FIG. 9 could be combined with non-zero angles of incidence $\Phi_2$ and/or $-\Phi_2$ for the laser pulses 145 such as that depicted in FIGS. 5 and 6.

Figure 10:
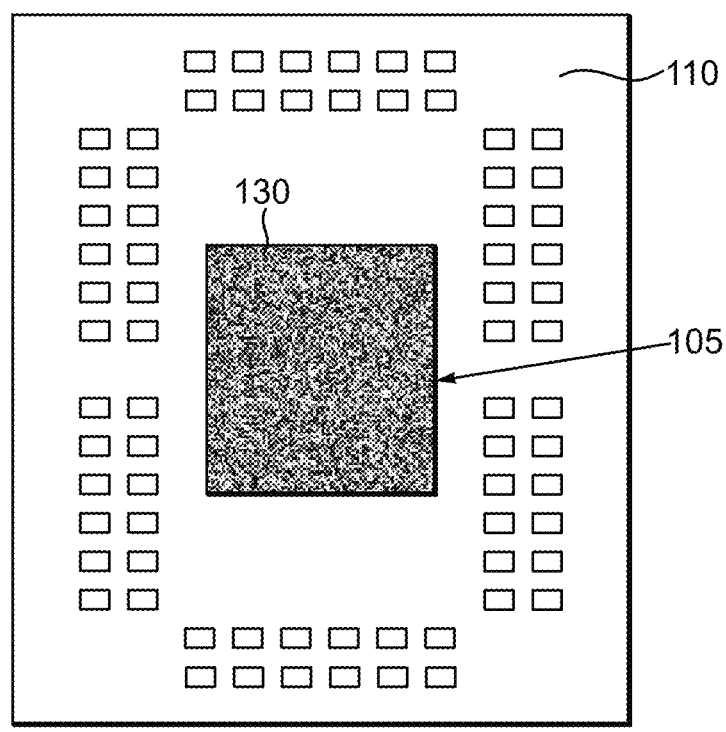
FIG. 10 is a plan view of an exemplary semiconductor chip with completed exemplary laser ablation craters.

FIG. 10 is an overhead view depicting the fully treated semiconductor chip 105 which has an intentionally damaged and highly textured backside 130. As noted above, while the entirety of the backside 130 can be subjected to laser treatment, in other arrangements, only sub-sets of the backside 130 need undergo laser treatment.

Figure 11:
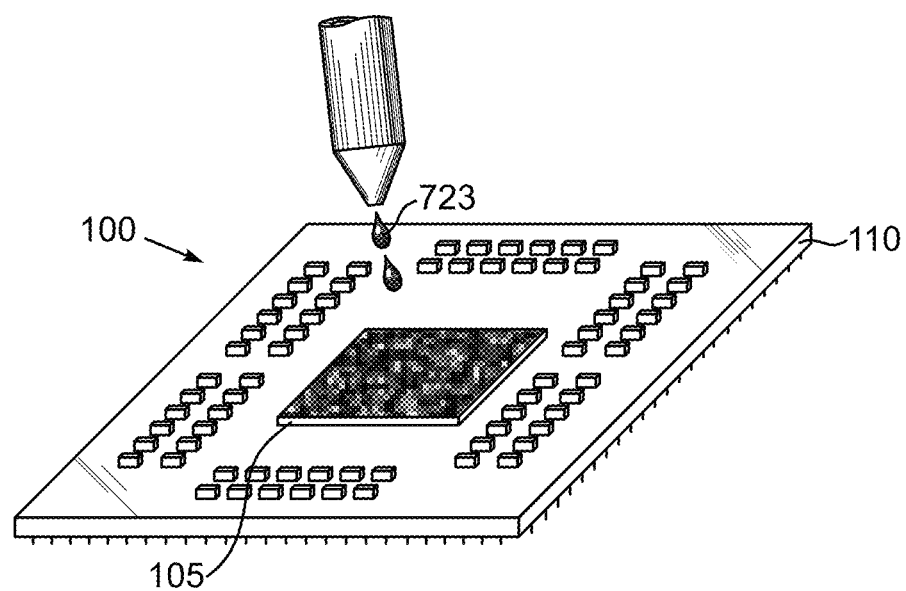
FIG. 11 is a pictorial view of an exemplary semiconductor chip device undergoing thermal interface material application.

FIG. 11 depicts a pictorial view of the semiconductor chip package 100 following the laser treatment of the semiconductor chip 105 thereof. With the chip laser treated, a thermal interface material 723 can be applied to the semiconductor chip 105 and of course any of the disclosed alternatives to facilitate the subsequent mounting of a heat spreader or sink (not shown) on the semiconductor chip 105. The thermal interface material 723 is advantageously composed of a variety of organic materials such as silicone, with or without conductive fillers such as silver or other particles or other types of thermal greases.

The disclosed arrangements utilize laser treatments on the semiconductor chips 105, 205, 305, etc. at the package stage. However, it should be understood that the laser treatment could be performed before or after the chips 105, 205, 305, 405, 505, 605 etc. are singulated from larger workpieces, such as wafers, but before they are mounted on a package or other type of circuit board.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a semiconductor chip having a first side and a second side opposite the first side;
   the first side having a plurality of laser ablation craters, each of the ablation craters having a bottom, some of the laser ablation craters have a first average depth and other of the laser ablation craters have a second average depth less than the first average depth; and
   a gettering region in the semiconductor chip beneath the laser ablation craters, the gettering region including plural structural defects, at least some of the structural defects emanating from at least some of the bottoms of the laser ablation craters.

2. The apparatus of claim 1, wherein at least some of the some of the laser ablation craters overlap laterally or at least some of the other of the ablation craters overlap laterally.

3. The apparatus of claim 1, wherein at least some of the some of the laser ablation craters or at least some of the other of the laser ablation craters comprise sloped sidewalls.

4. The apparatus of claim 3, wherein a first laser ablation crater of at least some of the some of the laser ablation craters or at least some of the other of the laser ablation craters comprises sidewalls sloped in a first direction and a second laser ablation crater of at least some of the some of the laser ablation craters or at least some of the other of the laser ablation craters adjacent to the first laser ablation crater comprises sidewalls sloped in a second direction opposite the first direction.

5. The apparatus of claim 1, wherein the structural defects comprise cracks and voids.

6. The apparatus of claim 1, wherein the semiconductor chip includes a portion more sensitive to excessive heating than another portion, some of the laser ablation craters proximate the another portion have a first average depth and other of the laser ablation craters proximate the portion have a second average depth less than the first average depth.

7. The apparatus of claim 1, comprising a circuit board, the semiconductor chip being mounted on the circuit board.

8. An apparatus, comprising:
   a package substrate;
   a semiconductor chip mounted on the package substrate and having a first side and a second side opposite the first side, the second side facing the package substrate;
   the first side having a plurality of laser ablation craters, each of the ablation craters having a bottom, some of the laser ablation craters have a first average depth and other of the laser ablation craters have a second average depth less than the first average depth; and
   a gettering region in the semiconductor chip beneath the laser ablation craters, the gettering region including plural structural defects, at least some of the structural defects emanating from at least some of the bottoms of the laser ablation craters.

9. The apparatus of claim 8, wherein at least some of the some of the laser ablation craters overlap laterally or at least some of the other of the ablation craters overlap laterally.

10. The apparatus of claim 8, wherein at least some of the some of the laser ablation craters or at least some of the other of the laser ablation craters comprise sloped sidewalls.

11. The apparatus of claim 10, wherein a first laser ablation crater of at least some of the some of the laser ablation craters or at least some of the other of the laser ablation craters comprises sidewalls sloped in a first direction and a second laser ablation crater of at least some of the some of the laser ablation craters or at least some of the other of the laser ablation craters adjacent to the first laser ablation crater comprises sidewalls sloped in a second direction opposite the first direction.

12. The apparatus of claim 8, wherein the structural defects comprise cracks and voids.

13. The apparatus of claim 8, wherein the semiconductor chip includes a portion more sensitive to excessive heating than another portion, some of the laser ablation craters proximate the another portion have a first average depth and other of the laser ablation craters proximate the portion have a second average depth less than the first average depth.

14. An apparatus, comprising:
a semiconductor chip having a first side and a second side opposite the first side;
the first side having a plurality of laser ablation craters, each of the ablation craters having a bottom, wherein some of the laser ablation craters have a first diameter and other of the laser ablation craters have a second diameter less than the first diameter; and
a gettering region in the semiconductor chip beneath the laser ablation craters, the gettering region including plural structural defects, at least some of the structural defects emanating from at least some of the bottoms of the laser ablation craters.

15. The apparatus of claim 14, wherein some of the laser ablation craters have the first diameter and other of the laser ablation craters have the second diameter less than the first diameter and still other of the laser ablation craters have a third diameter less than the second diameter.

16. The apparatus of claim 14, wherein a first laser ablation crater of the some of the laser ablation craters or the other of the laser ablation craters comprises sidewalls sloped in a first direction and a second laser ablation crater of the some of the laser ablation craters or the other of the laser ablation craters adjacent to the first laser ablation crater comprises sidewalls sloped in a second direction opposite the first direction.

17. The apparatus of claim 14, comprising a circuit board, the semiconductor chip being mounted on the circuit board.

18. The apparatus of claim 17, wherein the circuit board comprises a package substrate.

\* \* \* \* \*